US008641236B2

(12) United States Patent
Martinez et al.

(10) Patent No.: US 8,641,236 B2
(45) Date of Patent: Feb. 4, 2014

(54) INSULATED LED DEVICE

(75) Inventors: Aaron D. Martinez, Arvada, CO (US); Jared J. Wertz, River Falls, WI (US)

(73) Assignee: Air Motion Systems, Inc., River Falls, WI (US)

( * ) Notice: Subject to any disclaimer, the term of this patent is extended or adjusted under 35 U.S.C. 154(b) by 237 days.

(21) Appl. No.: 13/205,694

(22) Filed: Aug. 9, 2011

(65) Prior Publication Data

US 2012/0033431 A1    Feb. 9, 2012

Related U.S. Application Data

(60) Provisional application No. 61/372,060, filed on Aug. 9, 2010.

(51) Int. Cl.
*F21V 29/00*    (2006.01)

(52) U.S. Cl.
USPC ........... 362/294; 362/218; 362/264; 362/345; 362/373

(58) Field of Classification Search
USPC ........................... 362/294, 218, 264, 345, 373
See application file for complete search history.

(56) References Cited

U.S. PATENT DOCUMENTS

| | | | | |
|---|---|---|---|---|
| 5,188,451 | A * | 2/1993 | Shanks | 362/223 |
| 6,880,952 | B2 | 4/2005 | Kiraly et al. | |
| 2005/0056441 | A1 * | 3/2005 | Rider et al. | 174/35 R |
| 2005/0258439 | A1 | 11/2005 | Dry | |
| 2008/0143806 | A1 * | 6/2008 | Claeys | 347/102 |
| 2008/0239716 | A1 | 10/2008 | Lin | |
| 2010/0103667 | A1 * | 4/2010 | Thrailkill | 362/234 |

FOREIGN PATENT DOCUMENTS

| | | |
|---|---|---|
| JP | 2007-273972 | 10/2007 |
| JP | 2009-130204 | 6/2009 |

OTHER PUBLICATIONS

International Search Report and Written Opinion for PCT/US2011/046990.

* cited by examiner

*Primary Examiner* — Evan Dzierzynski
(74) *Attorney, Agent, or Firm* — Wm. Larry Alexander

(57) ABSTRACT

An LED device has an LED assembly connected to or abutting a heat sink, the heat sink connected to a cooling bridge and optionally enclosed within insulated connector end caps and crossover end caps and within a reflector cover and side cover. The cooling bridge conducts heat to the heat sink away from the reflector cover, and side cover, where the heat may be removed by a circulating coolant. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 C.F.R. §1.72(b).

19 Claims, 4 Drawing Sheets

SECTION A-A

US 8,641,236 B2

INSULATED LED DEVICE

CROSS-REFERENCES TO RELATED APPLICATIONS

This application claims priority under 35 U.S.C. §119 (e) to, and hereby incorporates by reference, U.S. Provisional Application No. 61/372,060, filed Aug. 9, 2010.

BACKGROUND OF THE INVENTION

1. Field of the Invention

This invention relates to light-emitting diodes and, in particular, this invention relates to a method for cooling a device using light-emitting diodes being used to generate and direct radiation.

2. Background

While LEDs represent a significant improvement in generating radiation for industrial uses, such as UV-polymerizing printing inks and coatings, these devices nonetheless produce significant amounts of heat. Unless dissipated or removed from LED-utilizing devices, the heat can distort any reflective surface and can significantly damage the LEDs themselves. There is then a need for an efficient and structurally straightforward design for removing unwanted heat from LED-utilizing devices.

SUMMARY OF THE INVENTION

This invention substantially meets the aforementioned needs of the industry by providing an LED device with a straightforward, yet efficient structure for removing heat from an operating LED device.

There is provided an LED device, the LED device including an LED assembly, a plurality of cooling bridges, a heat sink, a reflector cover, a side cover, a reflector, and connector and crossover end caps. The LED assembly may include a plurality of LED chips. The cooling bridges may be attached to or abut the heat sink. The reflector may be positioned by the reflector cover to direct radiation from the LED assembly. The connector and crossover end caps may include an electrically or thermally insulating material.

There is also provided a method of manufacturing an LED device, the method including 1) attaching a plurality of cooling bridges to a water rail, the water rail having a pair of axially formed channels; 2) positioning a reflector to direct radiation emitting from the LED chips; and 4) attaching a connection end cap and a crossover end cap to the water rail so as to form a fluidic circuit.

There is still yet formed a method of cooling an LED device, the LED device having an LED array, a reflector directing radiation emitted from the LED array, a water rail attached to, or abutting, the LED array, the water rail also attached to or abutting the cooling bridge, the method comprising circulating a coolant within axial channels formed in the water rail.

These and other features of this invention will become apparent from the description which follows, when considered in view of the accompanying drawings.

Figure 1:
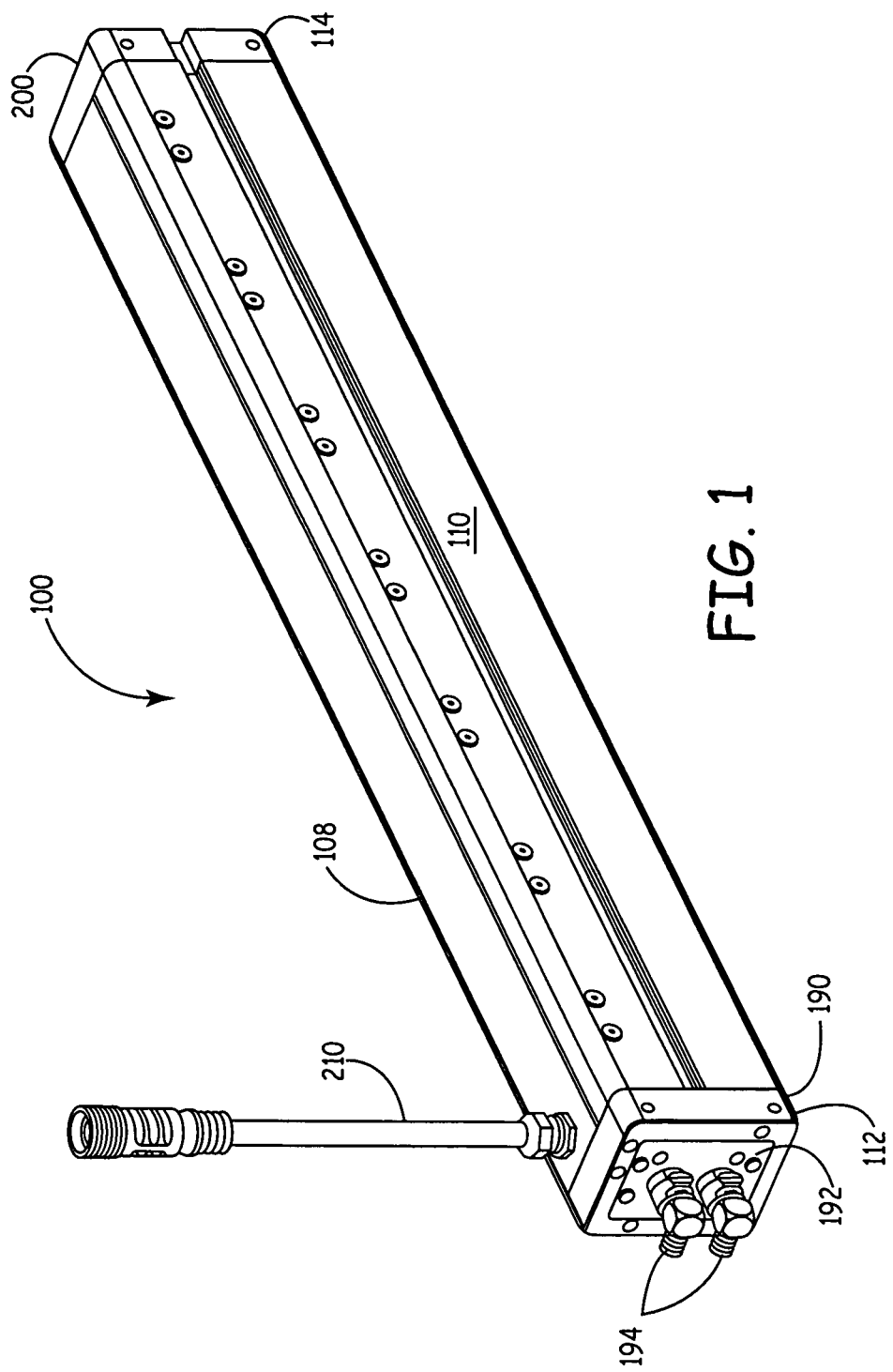
FIG. 1 is a perspective view of one embodiment of the insulated LED device of this invention.
Figure 2:
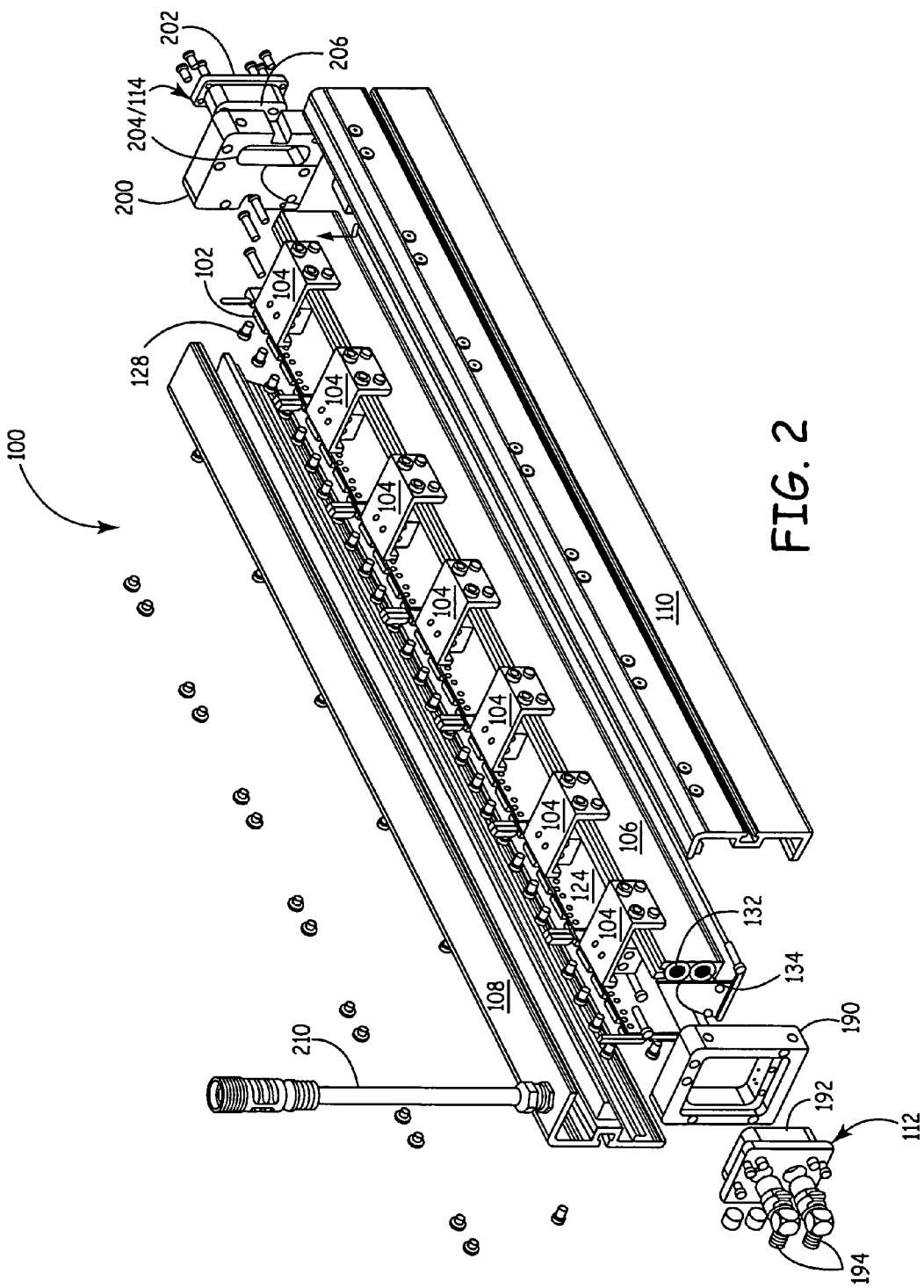
FIG. 2 is an exploded view of the insulated LED device of FIG. 1.
Figure 3:
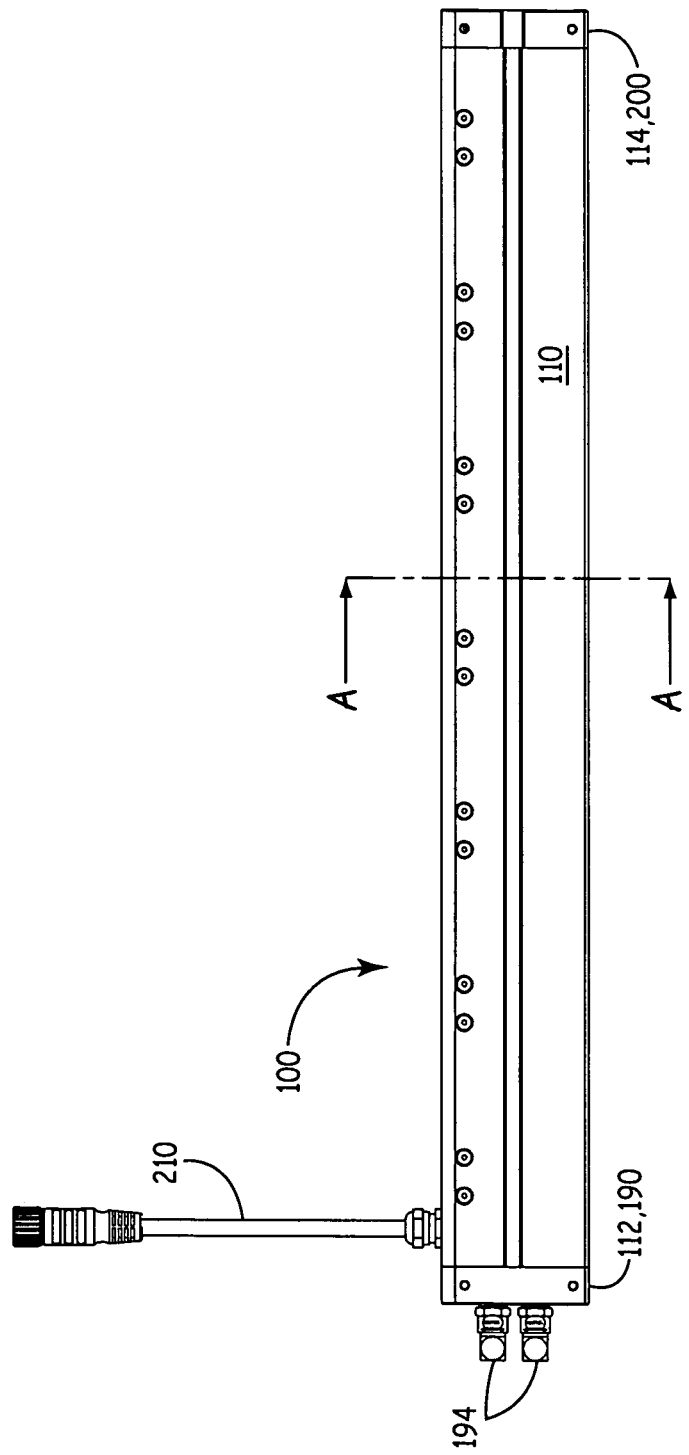
FIG. 3 is a side view of the insulated LED device of FIG. 1.
Figure 4:
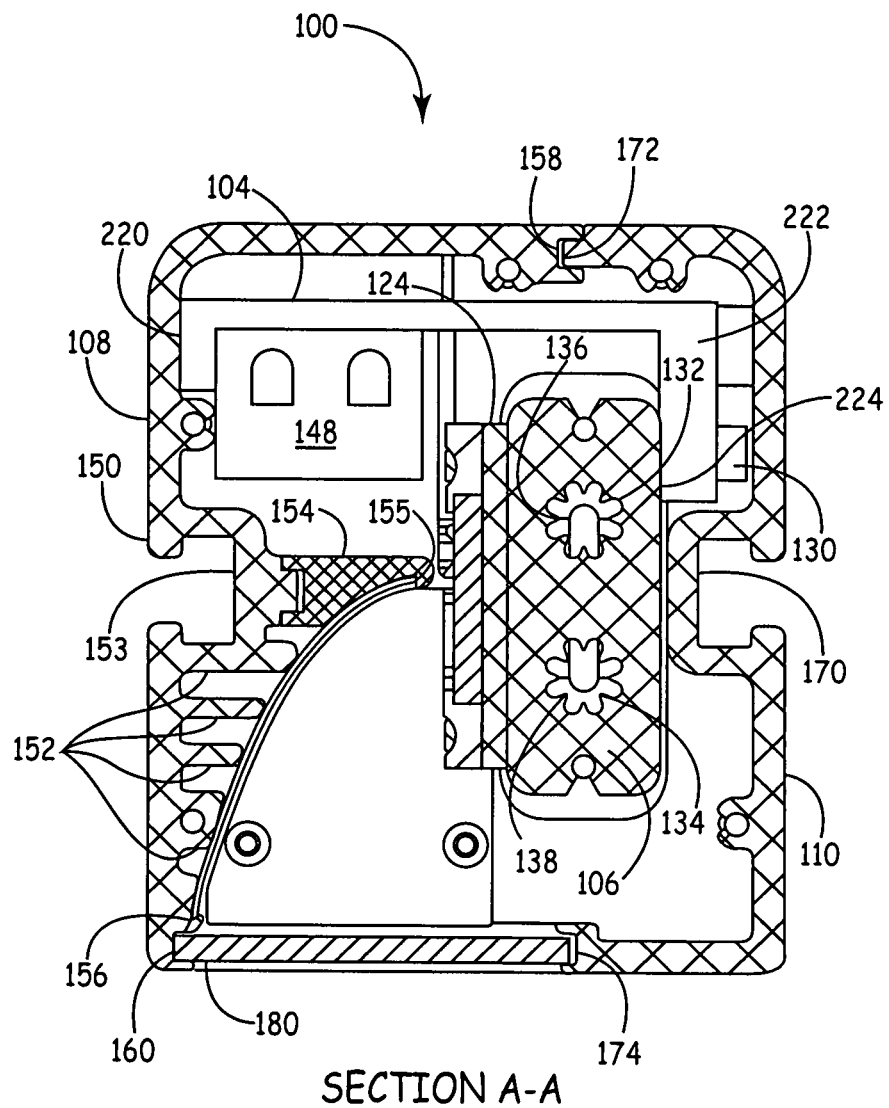
FIG. 4 is a cross section taken along line A-A of FIG. 3.

It is understood that the above-described figures are only illustrative of the present invention and are not contemplated to limit the scope thereof.

DETAILED DESCRIPTION

Unless otherwise defined, all technical and scientific terms used herein have the same meaning as commonly understood by one of ordinary skill in the art to which this invention belongs. Although methods and materials similar or equivalent to those described herein can be used to practice the invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Any references to such relative terms as front and back, right and left, top and bottom, upper and lower, horizontal and vertical, or the like, are intended for convenience of description and are not intended to limit the present invention or its components to any one positional or spatial orientation. Dimensions of the components in the attached figures may vary with a potential design and the intended use of an embodiment of the invention without departing from the scope of the invention.

Each of the additional features and methods disclosed herein may be utilized separately or in conjunction with other features and methods to provide improved devices of this invention and methods for making and using the same. Representative examples of the teachings of the present invention, which examples utilize many of these additional features and methods in conjunction, will now be described in detail with reference to the drawings. This detailed description is merely intended to teach a person of skill in the art further details for practicing preferred aspects of the present teachings and is not intended to limit the scope of the invention. Therefore, only combinations of features and methods disclosed in the following detailed description may not be necessary to practice the invention in the broadest sense, and are instead taught merely to particularly describe representative and preferred embodiments of the invention.

One embodiment of an insulated LED device of this invention is depicted in the figures at 100, and includes a light engine such as an LED assembly 102, a plurality of cooling bridges 104, a heat sink, such as a water rail 106, a reflector cover 108, a side cover 110, a connection end cap assembly 112, and a crossover end cap assembly 114. A person of ordinary skill in the art will readily recognize that the LED assembly 102 contains a plurality of LED chips 122 supported on a copper plate 124. Several configurations and materials for the LED assembly 102 may be present in the contemplated invention. Also present is a 7-pin connector 210 with leads.

In the embodiment depicted, the water rail 106 may be made from a thermally conductive material, such as aluminum. However, a person of ordinary skill in the art would readily recognize other acceptable materials for manufacturing the present water rail. When connected to the LED assembly 102 and the water rail 106, the plurality of cooling bridges 104 serve to conduct heat away from the LED assembly 102 and to position the LED assembly 102 so as to direct radiation being emitted from the present LED assembly. A plurality of finned channels 132, 134 may be axially defined in the water rail 106. Fins 136, 138, formed adjacent respective channels 132, 134, increase surface area of the water rail 106 adjacent the channels 132, 134, thereby more efficiently extracting heat from the water rail 106 when a coolant is circulated through the channels 132, 134. The coolant thusly circulated may be a liquid or a gas. Suitable liquids include water, polyethylene glycol-water solutions, liquefied nitrogen, and the like. Suitable gases include cooled atmospheric air. Connectors, such as screws 128, may be present to attach the cooling bridges to the heat sink of this invention.

A terminal block 144 may be used to jumper each light engine segment together, or to group light engines to allow one or more of the light engines to be controlled separately of the others, and may be attached to an underside of the cooling bridge and/or to the reflector cover. Terminal blocks allow for thermally and electrically insulated connections between light engines and external power sources.

The reflector cover 108 has an outer portion 150 and inner lobes 152 extending from the outer portion 150. The outer portion 150, at a channel 153 attaches to a lip structure 154, the lip structure 154 forming an axial slot 155. A slot 156 is formed at a lower portion of the outer portion 150. Another slot 160 is formed opening inboard at a lower location of the outer portion 150. The slots 155, 156 are positioned so as to accommodate a reflector 162. The reflector 162 is maintained at a desired position and configuration by being marginally disposed within the slots 155, 156 and by abutting the lobes 152.

The side cover 110 attaches to or contacts the water rail 106 at a channel 170. The side cover 110 terminates upwardly at an extension 172 and terminates downwardly at a slot 174. The extension 172 disposes within the slot 158 of the reflector cover 108. However, a person of ordinary skill in the art would recognize that extension 172 and slot 158 could be present on respective reflector cover 108 and side cover 110. The slot 174 of the side cover 110 and the slot 160 of the reflector cover 108 cooperate to accommodate and position a window 180.

The window 180 may be selected from materials allowing desired radiation wavelengths to pass therethrough, such as an acrylic or other material readily known to a person of ordinary skill in the art.

The connection end cap assembly 112 has a connection end cap 190 and a connection insulator block 192. The connection end cap 190 is secured to, and positions, the reflector and side covers 108, 110. The connection insulator block 192 is made of an electrically insulative material such as an acetyl polymer, Delran™ being one suitable material. However a person of ordinary skill in the art will readily recognize that other suitable materials may be used as well. Fittings 194 may attach to the connection insulator block 192 so as to connect to sources of coolant and to provide ingress and egress of coolant to the water rail 106. It is recognized that the fittings 194 will vary according to the coolant being used and conditions under which the water rail 106 is cooled and maintained.

The crossover end cap assembly 114 includes a crossover end cap 200 and a connection insulator block 202. The crossover end cap 200 defines a slot 204, which accommodates and positions the connection insulator block 202. The connection insulator block may be made from Delran™ or another suitably insulating material as described about with respect to the insulator block 192. The connection insulator block 202 defines a slot 206 which is dimensioned and positioned so as to direct coolant egressing from one of the channels 132, 134 to the other of the channels, thereby providing and completing a coolant circuit for the LED device 100 of this invention. Fluid-tight seals may be facilitated by the presence of O-rings (not shown) at each of the openings of the channels 132,134. One function of the insulator block is that the remainder of the instant LED device, aside from the LED assembly 102, cooling bridge 104, water rail 106, and reflector and side covers 108, 110, is not cooled, thereby more efficiently cooling the components of this invention needing to be maintained at a desired temperature.

An optional conduit 206 may contain electrical wires providing electricity to the LED assembly 102. The conduit 206, if present, may provide support and anchorage to the LED device 100 as well. While not shown, a person of ordinary skill in the art will recognize that a coolant supply apparatus may be operably present to provide and receive circulating coolant to and from the water rail 106. The coolant supply apparatus would vary depending on, for example, the coolant used and desired coolant temperatures and flow rates.

Thermal contacts 220, 222, 224 from the respective reflector cover 108, side cover 110, and water rail 106 are accomplished by abutting contact between these features and the cooling bridge 104. A percentage of radiated energy, such as heat, is absorbed by the irradiated extrusions (covers 106, 108) and reflector 162, which results in unwanted heating of these outer extrusions. The cooling bridge 104 of this invention thusly provides a path for the unwanted heat to be conducted from the reflector cover 108 and side cover 110 through the cooling bridge 106 to the water rail 106, which is a heat sink, thus lowering the temperature of the outer extrusions.

The cooling bridges 104 also provide uniform optical alignment between the radiation source (LED chips 122) and the reflector 162 by precisely tying the extrusions supporting the reflector 162 to the water rail 106 in several places along the length of the LED device 100 of this invention.

One suitable LED assembly has a plurality of LED chips 102 mounted to a heat-tolerant and electrically insulative resin such as an amorphous thermoplastic polyethermide. One suitable such polyethermide is Ultem® (SABIC Innovative Plastics). The heat-tolerant resin is mounted or bonded to a thermally conductive, but electrically insulative resin such as SARCON®, which is bonded or connected to a thermally and electrically conductive plate 124 such as copper or aluminum.

In addition to those disclosed above, other suitable polymers or synthetic resins are disclosed and described in the Handbook of Plastics, Elastomers, and Composites, Third Edition, Charles a Harper, Editor-in-Chief, McGraw-Hill New York (1996), which is hereby incorporated by reference in its entirety.

A person of ordinary skill in the art will readily appreciate that individual components shown on various embodiments of the present invention are interchangeable to some extent and may be added or interchanged on other embodiments without departing from the spirit and scope of this invention.

Because numerous modifications of this invention may be made without departing from the spirit thereof, the scope of the invention is not to be limited to the embodiments illustrated and described. Rather, the scope of the invention is to be determined by the appended claims and their equivalents.

What is claimed is:

1. An LED device comprising:
an LED assembly;
a reflector cover and a side cover
a plurality of heat-conducting cooling bridges, each of said cooling bridges comprising two generally planar portions separated by a generally transverse bend;
a heat sink attached to one of said planar portions of each of said plurality of cooling bridges, thereby forming a first thermal contact between said heat sink and each of said cooling bridges, a second thermal contact formed by each said cooling bridge abutting said reflector cover and, a third thermal contact formed by each said cooling bridge abutting said side cover;

a reflector positioned by a reflector cover to direct radiation from said LED assembly; and connector and crossover end caps.

2. The LED device of claim 1, further comprising means for coolant ingress and egress.

3. The LED device of claim 1, wherein said heat sink includes a water rail, said water rail defining a plurality of channels for coolant flow.

4. The LED device of claim 1, wherein said cooling bridges comprise a metal.

5. The LED device of claim 1, wherein said cooling bridges comprise aluminum.

6. The LED device of claim 1, wherein said connector and crossover end caps further comprise aluminum and a thermally insulative material.

7. The LED device of claim 6 wherein said insulating material comprises an acetyl polymer.

8. The LED device of claim 6 wherein the insulating material of the connector and crossover end caps contacts the heat sink.

9. The LED device of claim 1, wherein the heat sink comprises a water rail having a plurality of axially defined water rail channels.

10. The LED device of claim 9, wherein the crossover end cap defines a crossover end cap channel between said water rail channels.

11. The LED device of claim 1, wherein said reflector cover and side cover attach to the connector and crossover end caps.

12. The LED device of claim 11, further comprising a window extending between the reflector and side covers.

13. A method of manufacturing an LED device, comprising:

attaching an LED assembly to a heat sink, the LED assembly having a plurality of LED chips;

attaching a plurality of cooling bridges to the heat sink, said heat sink having a pair of axially formed channels, and wherein each of said cooling bridges comprises a pair of generally planar portions separated by a generally transverse bend and forming thermal contacts where each said cooling bridge contacts a reflector cover, a side cover and said heat sink;

positioning a reflector to direct radiation emitting from said LED chips; and attaching a connection end cap and a crossover end cap to said heat sink so as to form a fluidic circuit.

14. The method of claim 13, further comprising attaching said reflector cover and said side cover to said connection end cap and said crossover end cap.

15. The method of claim 14, further comprising positioning a window such that radiation from said reflector passes through said window.

16. The method of claim 14, wherein said reflector is positioned in said reflector cover.

17. A method of cooling an LED device, said LED device comprising an LED array, a reflector directing radiation emitted from said LED array, a water rail attached to said LED array and abutting a plurality of cooling bridges, each of said cooling bridges forming a plurality of thermal contacts with said water rail, a reflector cover, and a side cover, said method comprising circulating a coolant within axial channels formed in said water rail.

18. The method of claim 17, wherein said LED device further comprises a crossover end cap conducting fluid from one of said axial channels to another of said axial channels.

19. The method of claim 17, wherein said LED device further comprises a connection end cap and wherein said coolant is provided to said water rail from said connection end cap.

* * * * *